United States Patent [19]
Panicacci

[11] Patent Number: 6,087,970
[45] Date of Patent: Jul. 11, 2000

[54] ANALOG-TO-DIGITAL CONVERSION

[75] Inventor: Roger Panicacci, Los Angeles, Calif.

[73] Assignee: Photobit Corporation, Pasadena, Calif.

[21] Appl. No.: 09/038,887

[22] Filed: Mar. 11, 1998

[51] Int. Cl.[7] .................................................. H03M 1/12
[52] U.S. Cl. ............................................................ 341/172
[58] Field of Search ...................................... 341/172, 139, 341/143, 144, 166

[56] References Cited

U.S. PATENT DOCUMENTS 5,892,472  4/1999  Shu et al. ................................. 341/139

*Primary Examiner*—Brian Young
*Attorney, Agent, or Firm*—Fish & Richardson P.C.

[57] ABSTRACT

A circuit has an analog-to-digital converter that, during a first mode of the circuit, is configured to use capacitors of the converter to furnish a digital representation of an analog input voltage. The circuit also has an amplifier that has a gain responsive to a capacitance, and the switches are configured to, during a second mode of the circuit, selectively connect the capacitors to the amplifier to select the gain.

18 Claims, 5 Drawing Sheets

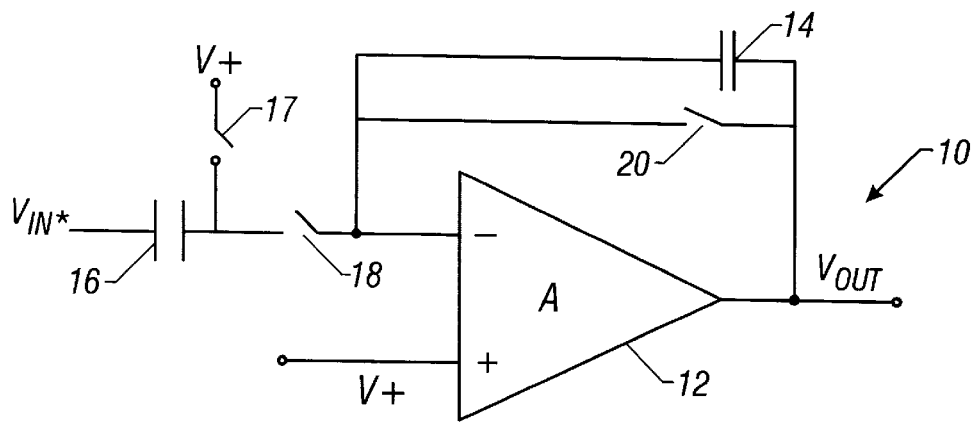
FIG. 1
*(Prior Art)*
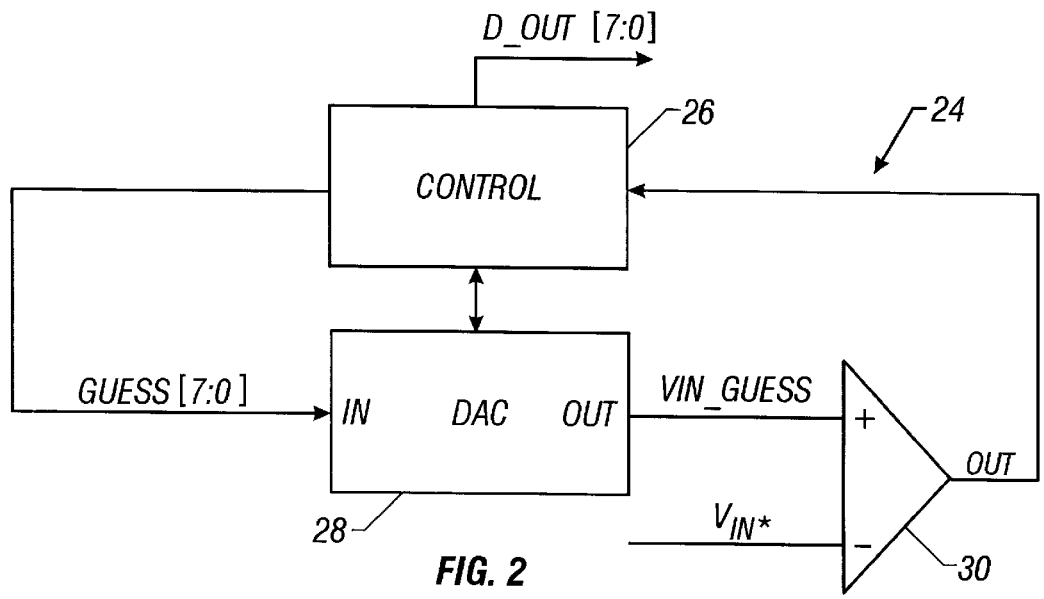
FIG. 2
*(Prior Art)*
| GUESS [7:0] | OUT |
|---|---|
| 10000000 | H |
| 01000000 | L |
| 01100000 | L |
| ⋮ | ⋮ |
| 01100001 | |
FIG. 3
*(Prior Art)*

| CLR_ADC[7:0] | S[7:0] | C_OUT | DOUT[7:0]# | DOUT[7:0] |
|---|---|---|---|---|
| 01111111 | 10000000 | H | 11111111 | 00000000 |
| 10111111 | 01000000 | L | 10111111 | 01000000 |
| 10011111 | 00100000 | L | 10011111 | 01100000 |
| 10001111 | 00010000 | H | 10011111 | 01100000 |
| ⋮ | ⋮ | ⋮ | ⋮ | ⋮ |
| 10011110 | 00000001 | L | 10011110 | 01100001 |

ANALOG-TO-DIGITAL CONVERSION

BACKGROUND

The invention relates to analog-to-digital conversion.

In typical analog-to-digital conversion, a reference voltage level is used to generate a digital representation of an analog input signal. Signal resolution is often maximized when the expected range of the analog input signal matches the reference voltage level. However, quite often the input signal to be converted has a much lower voltage level than the reference voltage level.

For example, an output of a CMOS image sensor may have a relatively low voltage level (as compared to the reference voltage level) due to a low light condition or operation at a high frame rate.

Performance from an analog-to-digital converter (ADC) may sometimes be increased by amplifying the output of the CMOS sensor to provide a stronger analog input signal to the ADC. Also, because signal strengths may vary with the environment or operating conditions of the sensor, it may be desirable for the amplifier to have a variable gain to accomodate these variations.

FIG. 1 shows a switched capacitor integrator 10 which may be used to amplify an output (represented by a sampled voltage called Vin*) of the sensor before A/D conversion. The integrator 10 uses complementary nonoverlapping clock signals to control on/off switches 17, 18 and 20 to transfer charge through capacitors 14 and 16 of the integrator 10. The capacitor 14 (typically the larger of the two capacitors) is connected in a feedback path between an inverting input and an output of an operational amplifier 12. The switch 20 selectively shorts across the capacitor 14 when connecting the output of the amplifier 12 to the inverting input.

The capacitor 16 has one terminal receiving the sampled input voltage Vin*. Another terminal of the capacitor 16 is alternatively connected (by the switches 17 and 18) between a reference voltage level V+ and an input terminal of the amplifier 12. The gain of the integrator 10 is ideally proportional to the ratio between the capacitances of the capacitors 14 and 16.

FIG. 2 shows another type of analog-to-digital converter 24 which uses a technique known as successive approximation. In this technique, a digital representation (called D_OUT[7:0]) of the sampled voltage Vin* is derived by a sequence of structured estimates, or guesses. Each guess is represented by a multi-bit signal called GUESS[7:0] and is formed from the voltage Vin* by control logic 26. To evaluate the accuracy of each guess, the converter 24 has a comparator 30 (which furnishes an output called OUT). A digital-to-analog converter (DAC) 28 is used to convert the digital signal GUESS[7:0] into its analog equivalent (called VIN_GUESS) for comparison by the comparator 30 with the voltage Vin*. Typically, one bit is tested (i.e., one guess is performed) during each step of the sequence. Thus, the number of guesses (and clock cycles) required to generate the digital representation DOUT[7:0] is equal to the number of bits of the representation. For example, the converter 24 spends eight clock cycles generating the eight bit representation D_OUT[7:0].

FIG. 3 shows an example of a successive approximation sequence. The control logic 26 might be configured to start with the most significant bit of D_OUT[7:0] (i.e., D_OUT [7]) and process the bits of D_OUT[7:0] in descending order. For example, assuming the correct value of D_OUT [7:0] is "b01100001" (wherein the prefix "b" indicates a binary representation), the first guess might be "b10000000" to test the most significant bit of D_OUT[7:0]. In response to this guess, the comparator 30 drives its output (represented by OUT) high. This indicates to the control logic 26 that the guess was higher than the actual value. As a result, the control logic 26 knows that the most significant bit of D_OUT[7:0] has a logic zero level.

The control logic 26 then tests the value of the next significant bit (D_OUT[6]) by guessing "b01000000." In response to this guess, the comparator 30 drives its output low which indicates to the control logic 26 that the guess was lower than the actual value. Because the control logic 26 knows that the most significant bit (D_OUT[7]) has a logic zero level, the control logic 26 then deduces that the bit D_OUT[6] must have a logic one level, and it follows, that one or more of the bits D_OUT[5:0] have a logic one level. The control logic 26 then tests the next most significant bit (D_OUT[5]) by guessing "b01100000," and the sequence continues until the logic levels of all bits of the representation D_OUT[7:0] have been determined.

SUMMARY OF THE INVENTION

In general, in one aspect, the described system features a circuit that has first and second modes. The circuit has an analog-to-digital converter that, during the first mode, is configured to use capacitors of the converter to furnish a digital representation of an analog input voltage. The circuit also has an amplifier that has a gain responsive to a capacitance, and the switches are configured to, during the second mode, selectively connect the capacitors to the amplifier to select the gain.

Implementations may include one or more of the following. The second mode may occur at a time other than during the first mode. The circuit may also have logic that is configured to operate the switches and store the digital representation. The amplifier (e.g., a switched capacitor integrator) may also be configured to receive the analog input voltage and furnish an amplified representation of the analog input voltage to the analog-to-digital converter. The analog-to-digital converter (e.g., a successive approximation converter) may be disabled during the second mode, and the amplifier may be disabled during the first mode.

The circuit may also have a sample and hold circuit that is configured to furnish the analog input voltage. The analog-to-digital converter may include a comparator that has a first input is connected to a first reference potential and a second input connected to one terminal of the capacitors. The comparator may be configured to selectively connect other terminals of the capacitors to either the first reference potential or a second reference potential to furnish the digital representation.

The amplifier may include an analog amplifier, and the capacitors may be selectively connected in series with a feedback path of the amplifier during the second mode. The circuit may have a switch that is configured to connect the amplifier to the analog-to-digial converter during the second mode and disconnect the output from the analog-to-digial converter during the first mode.

In general, in another aspect, the described system features a method that includes during a first mode, using capacitors to furnish a digital representation of an analog input voltage, and during a second mode, using the capacitors to select a gain of an amplifier.

Among the advantages of the invention are one or more of the following. A variable gain may be added to the input of an analog-to-digital converter while consuming only a minimal amount of area. The gain of the amplifier is programmable and may be changed. For an active pixel sensor array, different gains may be set for each column of the array.

Other advantages will become apparent from the following description and from the claims.

BRIEF DESCRIPTION OF THE DRAWING

FIG. 1 is a schematic diagram of an integrator.

FIG. 2 is a schematic diagram of an analog-to-digital converter.

FIG. 3 is a table illustrating the generation of the output of the converter of FIG. 2.

DESCRIPTION OF THE PREFERRED EMBODIMENTS

Figure 4:
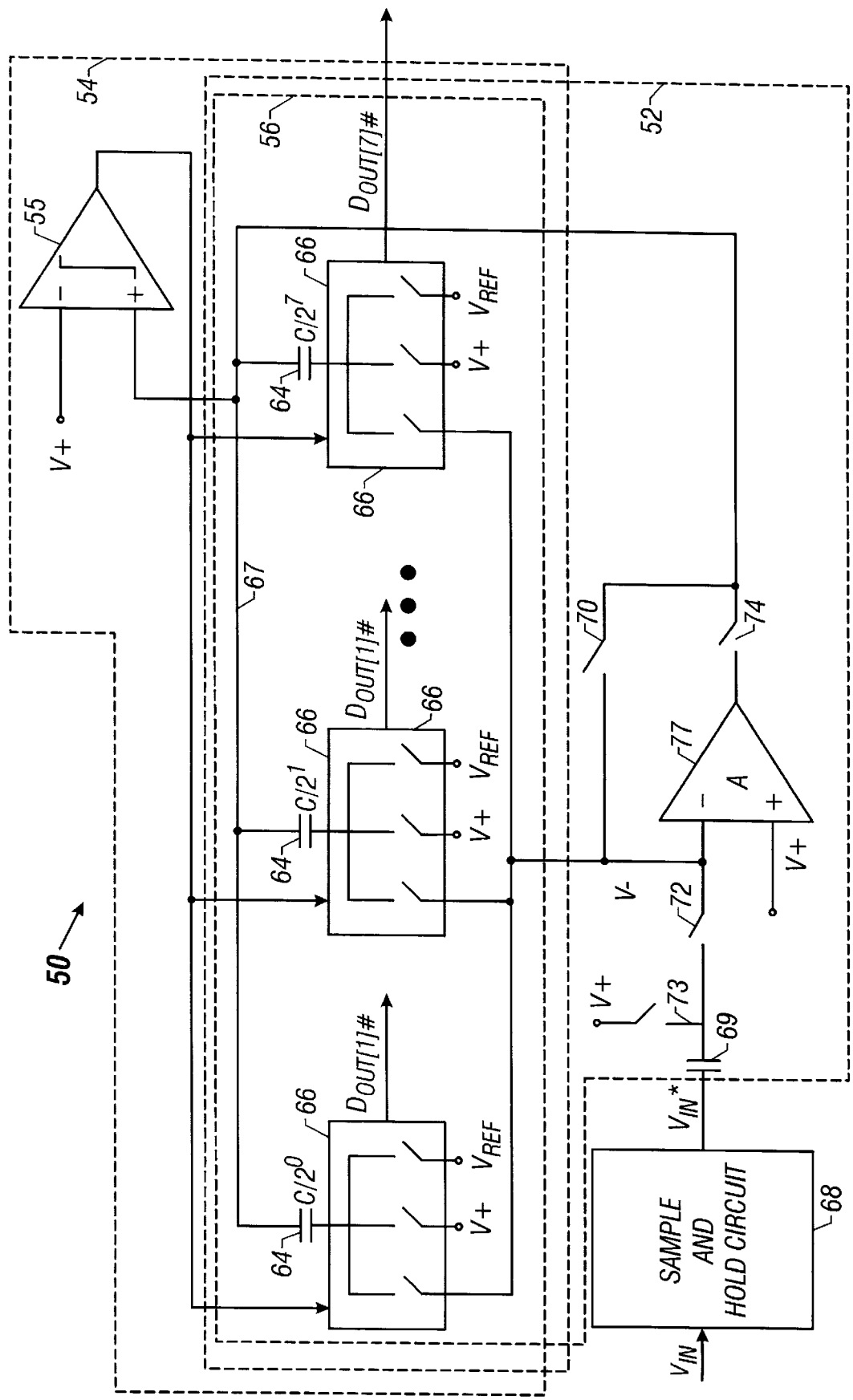
FIG. 4 is a schematic diagram of an analog-to-digital converter according to one embodiment of the invention.

FIG. 4 shows a circuit 50 that includes a switched capacitor integrator 52 and a charge redistribution successive approximation analog-to-digital (A/D) converter 54. These elements share circuitry that is used to perform both amplification and A/D conversion. The amplification is used during an amplification mode of the circuit 50 when the circuit amplifies a sampled analog input voltage called Vin*. The A/D conversion is used during a conversion mode of the circuit 50 when the circuit converts the amplified sampled voltage Vin* into a digital representation.

The shared circuitry includes a network 56 having an array of binary scaled capacitors 64 which the converter 54 uses to perform digital-to-analog (D/A) conversions of "guesses" used in the successive approximation sequence. During the amplification mode, the integrator 52 amplifies the voltage Vin* by a gain value (i.e., a gain value of $2^n$, where n represents an integer having a value from zero to seven) that is programmed into the network 56.

During the amplification mode of the circuit 50, the integrator 52 amplifies the sample input voltage Vin* (provided by a sample and hold circuit 68 that receives an input voltage Vin) and stores the amplified sample in capacitors 64 of the network 56. As typical for inverting integrators, the gain of the integrator 52 is determined by the ratio of a feedback capacitance to a capacitance serially connected with the input.

However, unlike typical integrators, the integrator 52 uses the network 56 to establish the value of the feedback capacitance, and thus, the gain for the integrator 52. To accomplish this, before the amplication mode begins, groups of switch circuits 66 (one group for each capacitor 64 of the network 56) are used to selectively connect associated capacitors 64 of the network 56 in parallel with the feedback path of the integrator 52.

The integrator 52 has an inverting configuration with an inverting input of the integrator 52 receiving the sampled voltage Vin* and a noninverting input of the integrator 52 being connected to a reference voltage V+. The output of the integrator 52 is connected to one terminal of each capacitor 64 (i.e., all capacitors 64 have one terminal connected to a line 67), leaving the connection of the other, free terminal of each capacitor 64 determinative of whether or not the capacitor 64 is connected in the feedback loop.

Thus, if the free terminal of the capacitor 64 is connected to the inverting input node V– of the amplifier 77, the capacitor 64 is connected in the feedback loop. If the the free terminal is instead connected to the reference voltage V+, the capacitor 64 is neither a part of the feedback loop nor contributes to select the gain of the integrator 52.

In typical processing, the amplication mode precedes the conversion mode to store an amplified version of the voltage Vin* in the capacitors 64. This amplified version of the voltage Vin* appears on the line 67. After this occurrence, the circuit 50 enters the conversion mode, during which the A/D converter 54 uses the successive approximation sequence to derive an inverted digital representation (called DOUT[7:0]#, with the positive representation called DOUT [7:0]) of the sampled voltage Vin*. After the conversion mode, the gain of the integrator 52 is programmed again before another amplification mode begins.

Because the gain of the integrator 52 can be changed before each amplification mode, different samples of the input voltage Vin may be amplified by different values. As a result, the circuit 50 can accomodate changes in the strength of the Vin signal. Furthermore, the circuit 50 provides advantages when used to process the outputs of, for example, Active Pixel Sensors (APS)s.

A typical APS has columns of charged coupled devices (CCD)s that are used to capture a snapshot of an image, and the APS may be used to capture color images by covering different CCDs with different spectrum-discriminating filters so that each CCD is configured to respond to a different primary color (e.g., red, green or blue). When used with the circuit 50, more gain may be applied to the CCD outputs associated with a selected primary color than to other columns associated with other primary colors. This has advantages, for example, when it is desirable to increase the perceived luminance of the captured image by amplifying the outputs of the CCDs that represent a predetermined one of the primary colors (e.g., the green color). The ability to change the gain of the circuit 50 also has applications in, for example, non-linear signal processing, such as gamma correction.

The converter 54 accomplishes the conversion by using each one of the switch circuits 66 to furnish one bit of the DOUT[7:0]# signal. Beginning with the most significant bit DOUT[7], the converter 54 estimates, or guesses at, the value of one bit of DOUT[7:0] (leaving the other bits unchanged) during each step of the sequence. The guess is indicated by the connection status of the capacitors 64.

For bits of DOUT[7:0] that are guessed or known to have a logic one level, the converter 54 uses the switch circuits 66 to connect the capacitors 64 associated with the logic one bits to the voltage reference level V+. For bits of DOUT[7:0] that are subsequently determined to have a logic zero level, the converter 54 uses the switch circuits 66 to connect the capacitors 64 associated with the logic zero level bits to a higher voltage reference level called VREF.

The results of each guess are indicated by the voltage level of the line 67. If the voltage level of the line 67 is greater than the reference level V+, then the guess is high and the logic level of the corresponding bit of DOUT[7:0] is set to a logic zero level. Otherwise, the corresponding bit of D[7:0] is left at the logic one level. The converter 54 has a comparator 55 to compare the voltage of the line 67 with the reference voltage V+. The output of the comparator 55 is received by the switch circuits 66 which update the connection status of associated capacitors 64 after each guess.

The integrator 52 is disabled during the conversion mode and enabled during the amplification mode. To accomplish this, an operational amplifier 77 (which provides required gain for integration) of the integrator 52 has an output that is connected (via a switch 74) to the output of the integrator 52 to enable the integrator 52 and disconnected from the output to disable the integrator 52.

The integrator 52 uses two complementary, nonoverlapping clock signals to control on/off switches 70, 72, and 73 to transfer charge through a capacitor 69 and through the equivalent capacitor formed by capacitors 64 of the network 56. The operational amplifier 77 has its noninverting input functioning as the noninverting input of the integrator 52 (and connected to the voltage level V+) and its inverting input functioning as the inverting feedback node V− of the integrator 52.

The switch 70 selectively connects the node V− to the output terminal of the integrator 52. The switch 72 selectively connects one terminal of the capacitor 69 to the V− node. The same terminal of the capacitor 69 is selectively connected to the voltage reference level V+ through the switch 73. The other terminal of the capacitor 69 receives the voltage Vin*.

Figure 5A:
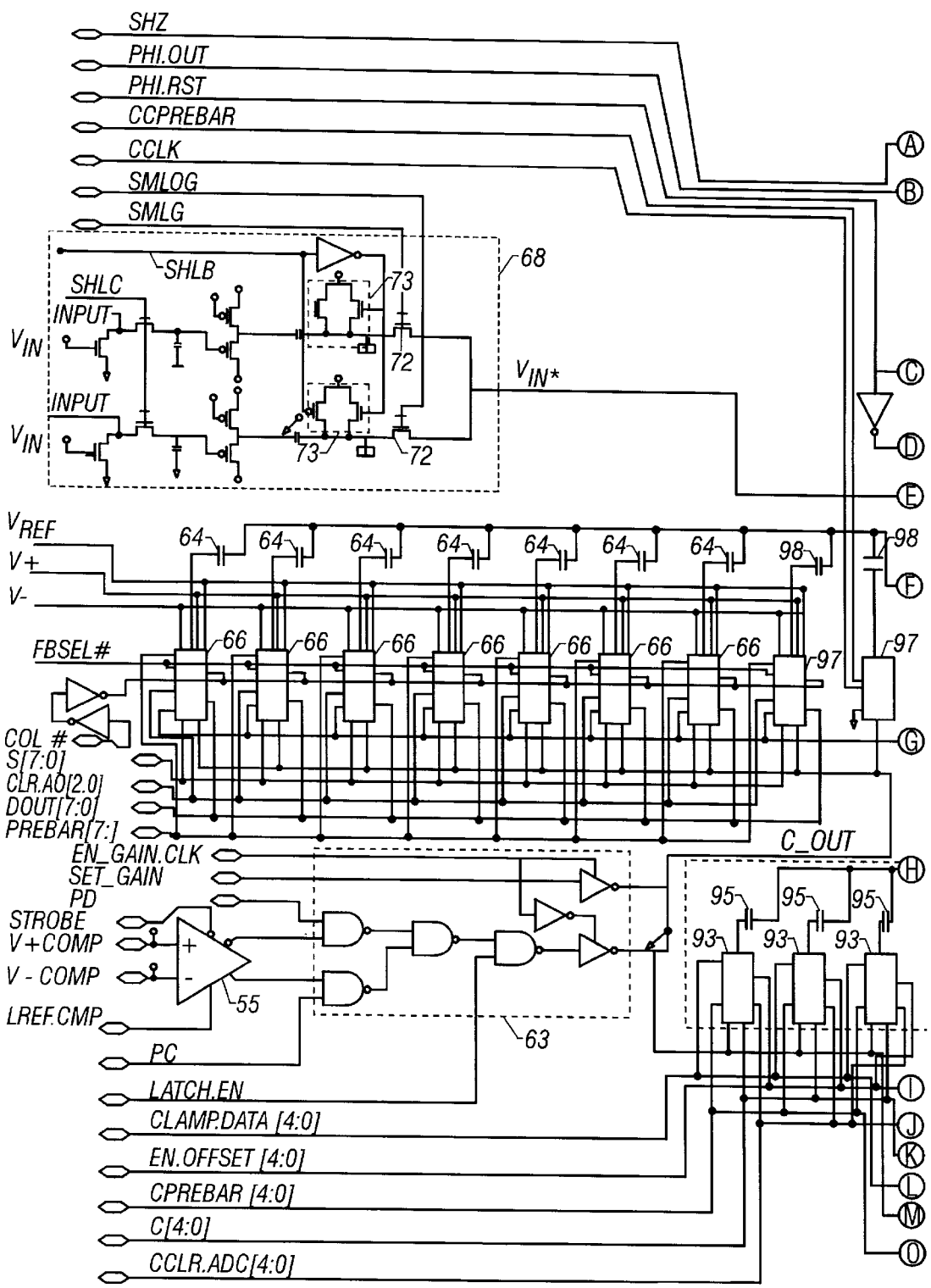
FIG. 5 is a more detailed schematic diagram of the converter of FIG. 4.
Figure 5B:
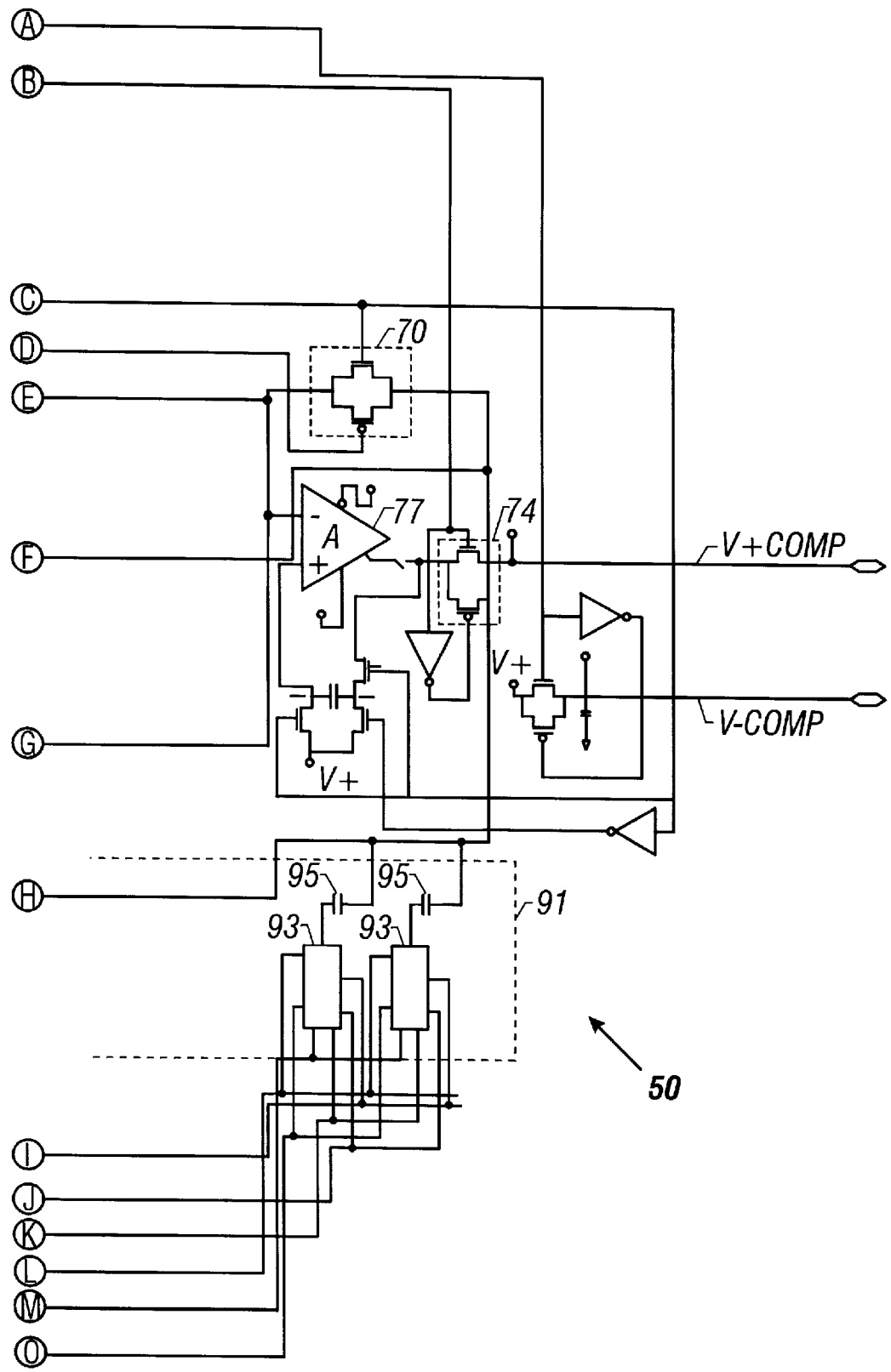

Referring to FIG. 5, during the amplification mode, the switch circuits 66 are programmed to select the gain of the integrator 52, i.e., the switch circuits 66 are programmed to either connect the associated capacitor 64 to the V− node (i.e., to connect the capacitor 64 in the feedback loop of the integrator 52) or the V+ reference voltage level (i.e., to disconnect the capacitor 64 from the feedback loop of the integrator 52). To accomplish this, each switch circuit 66 receives one bit of a multi-bit signal called CLR_ADC[7:0]. When one of the bits of the CLR_ADC[7:0] signal is indicative of logic zero, the associated capacitor 64 is connected to the feedback loop of the integrator 52, and when one of the bits of CLR_ADC[7:0] is indicative of logic one, the associated capacitor 64 is disconnected from the feedback loop of the integrator 52. To indicate the amplification mode, a signal called FBSEL# is furnished to the switch circuits 66. Assertion, or driving low, of the FBSEL# signal indicates the amplification mode. Deassertion, or driving high, of the FBSEL# signal indicates the conversion mode.

During the conversion mode, the switch circuits 66 collectively provide the bits of the DOUT[7:0]# signal, modify one bit of the DOUT[7:0]# signal in response to each guess, and store an analog representation of the guess in the capacitors 64. To accomplish this, each switch circuit 66 receives a different bit of the CLR_ADC[7:0] signal and receives a different bit of a multi-bit signal called S[7:0]. During the conversion mode, the bits of the CLR_ADC[7:0] signal represent an inverted, digital representation of the guess, and the signal S[7:0] points to the bit of CLR_ADC[7:0] that currently is being tested. To point to a particular bit of CLR_ADC[7:0], seven out of the eight bits of the signal S[7:0] have logic zero levels, with the position of the remaining bit (having a logic one level) pointing to the bit of CLR_ADC[7:0] being tested.

When one of the bits of the CLR_ADC[7:0] signal is indicative of logic one, the associated capacitor 64 is connected (by the switch circuit 66) to the voltage reference level V+, i.e., the corresponding bit of the guess is at a logic zero level. When one of the bits of CLR_ADC[7:0] signal is indicative of logic zero and the bit is not currently being tested, the associated capacitor 64 is connected (by the switch circuit 66) to the voltage reference level VREF. However, if the bit is currently being tested (as indicated by the signal S[7:0]), then the connection of the capacitor 64 is dependent on the level of a signal called C_OUT which is indicative of the output of the comparator 55.

If the C_OUT signal is high, the guess is high and the associated capacitor 64 is connected (by the switch circuit 66) to the voltage level V+. However, if the C_OUT signal is low, the guess is low, and the associated capacitor 64 is connected to the voltage level VREF. As the bits of DOUT [7:0]# are determined, the corresponding bits of CLR_ADC [7:0] are updated.

Referring to FIG. 8, as an example, the converter 54 undergoes a successive approximation sequence to determine the digital equivalent of the sampled voltage Vin*. In this example, the sampled voltage Vin* is digitally represented by "b01100001." In the first step of the sequence, the most significant bit of DOUT[7:0]# (i.e., D_OUT[7]#) is tested by setting CLR_ADC[7:0] equal to "b01111111" and S[7:0] equal to "b10000000." In response to these signals, the C_OUT signal is driven high which means the guess was high, and the most significant bit DOUT[7]# has a logic one level. The next most significant bit is tested in the next step of the sequence by setting CLR_ADC[7:0] equal to "b10111111" and S[7:0] equal to "b01000000."

The most significant bit of CLR_ADC[7:0] (i.e., CLR_ADC[7]) is set to a logic one level (i.e., the most signifcant bit of DOUT[7:0]# set to a logic one level) in response to the previous step (i.e., step one) of the sequence. In response to the settings of step two, the C_OUT signal is driven low which means the guess was lower than the actual value, and the second most significant bit of DOUT[7:0]# (i.e., DOUT [6]#) is set equal to a logic zero level. This successive approximation sequence continues for six more steps, and at the completion of the sequence, DOUT[7:0]# equals "b10011110," the inverted digital representation of the sampled voltage Vin* for this example.

For purposes of furnishing the C_OUT signal, the converter 54 has logic 63 which is coupled beween the output of the comparator 55 and the switch circuits 66. During the conversion mode the C_OUT signal follows the output of the comparator 55. However, during the amplification mode, the C_OUT signal is driven to low (regardless of the output of the comparator 55) which permits (as described below) the switch circuits 66 to store the gain needed for amplification. To accomplish this, the logic 63 receives a signal called SET_GAIN, which is asserted, or driven high, during the amplification mode and deasserted, or driven low, during the conversion mode.

Figures 6, 7:
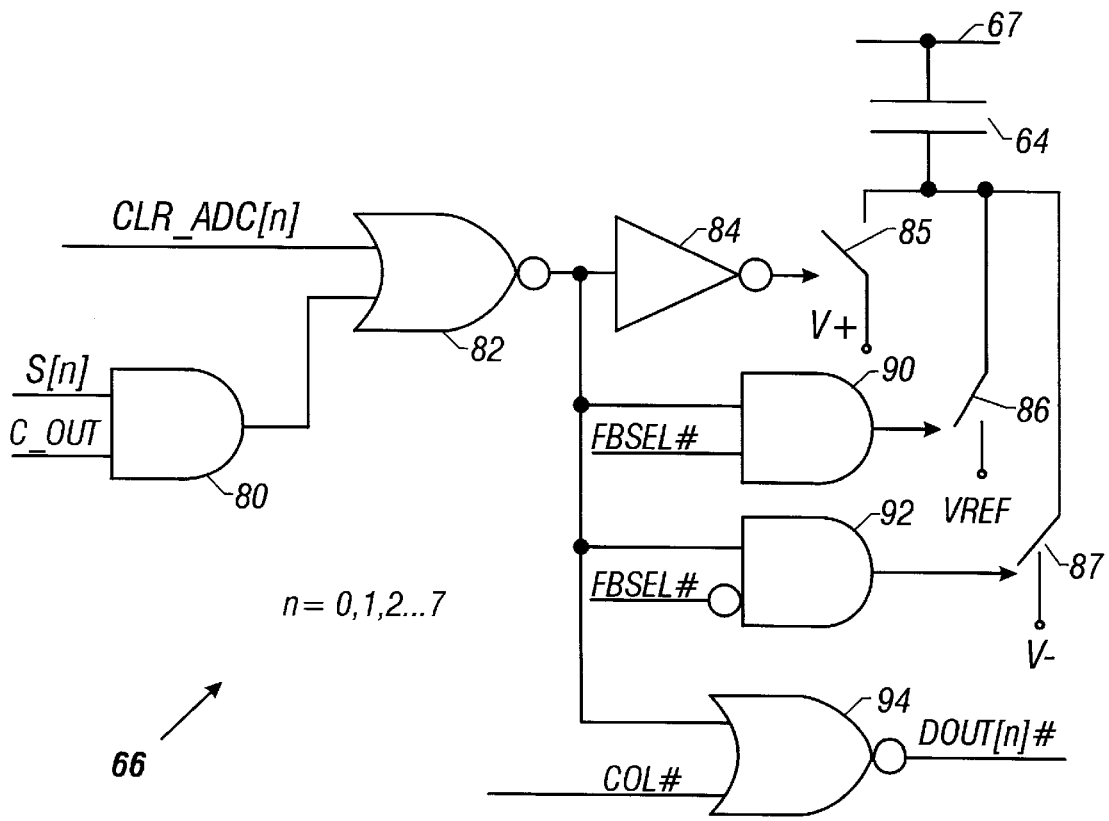
FIG. 6 is a table illustrating the generation of the output of the converter of FIGS. 4 and 5.
FIG. 7 is a schematic diagram of switch circuits of the converter of FIGS. 4 and 5.

Referring to FIG. 6, in one logical representation, the switch circuit 66 has a NOR gate 82 that receives one bit of the CLR_ADC[7:0] signal and is connected to the output of an AND gate 80. The AND gate 80 receives one bit of the S[7:0] signal (having the same bit position as the bit of the CLR_ADC[7:0] signal) and the C_OUT signal. The output of the NOR gate 82 controls a switch 85 that is serially coupled between the capacitor 64 and the reference voltage level V+. The output of the NOR gate 82 is also received by a NOR gate 94 which also receives an output enable signal called COL#. The NOR gate 94 furnishes one bit DOUT[n]# of the DOUT# signal. The output of the NOR gate 94 is an inverted representation of the output of the NOR gate 82 when the signal COL# is asserted, or driven low.

When the output of the NOR gate 82 is driven low (i.e., when the bit CLR_ADC[n] is at a logic one level or both the bit S[n] and the C_OUT are at logic one levels), the switch 85 connects the capacitor 64 to the reference voltage level V+, and (assuming the COL# signal is asserted, or driven low) the bit DOUT[n]# is set to a logic one level. An inverter 84 is connected between the NOR gate 82 and the switch 85.

When the output of the NOR gate 82 is driven high (i.e., when both the bit CLR_ADC[n] is at a logic zero level and either the bit S[n] or the C_OUT signal are at a logic zero level), either a switch 86 connects the capacitor 64 to the reference voltage level VREF or a switch 87 connects the capacitor 64 to the node V−, depending on the level of a signal called FBSEL#. The FBSEL# signal is asserted, or driven low, during the amplification mode and deasserted, or driven high, during the conversion mode. An AND gate 90 receives the FBSEL# signal and the output of the NOR gate 82, and the output of the AND gate 90 controls a switch 86 that connects the capacitor 64 and the voltage reference level VREF. An AND gate 92 receives an inverted FBSEL# signal and the output of the NOR gate 82, and the output of the AND gate 92 controls a switch 87 that connects the capacitor 64 to the node V−.

When the FBSEL# signal is asserted (to indicate the amplification mode) and the output of the NOR gate 82 is driven high, then the AND gate 92 controls the switch 87 to connect the capacitor 64 to the V− reference voltage level. When the FBSEL# signal is deasserted (to indicate the conversion mode) and the output of the NOR gate 82 is driven high, then the AND gate 90 controls the switch 86 to connect the capacitor 64 to the VREF reference voltage level, and (assuming the COL# signal is asserted, or driven low) the AND gate 94 sets the bit DOUT[n]# equal to a logic zero level.

Referring back to FIG. 5, the circuit 50 also has a network 91 to compensate for offset voltages in the circuit 50, such as an offset volage of the comparator 55. The network has an array of binary scaled capacitors 95. One terminal of each capacitor 95 is connected to the line 67, and the other terminal of each capacitor 95 is selectively connected by an associated switch circuit 93 to either the voltage reference level VREF or the voltage reference level V+. Similar in design and operation to the switch circuits 64, the switch circuits 93 receive and use multi-bit signals C[4:0] (analagous to the S[7:0] signal), C_OUT, and CCLR_ADC [4:0] (analagous to the CLR_ADC[7:0] signal) to perform a successive approximation sequence (with the input voltage Vin being grounded) to determine a compensation voltage needed to overcome the offset voltage of the circuit 50. Once the compensation voltage is determined, the CLR_ADC [7:0] signal configures the switch circuits 93 to connect the capacitors 95 to the reference voltages V+ and VREF in a manner to store the desired compensation voltage in the capacitors 64 and 95.

Besides the capacitors 64 and 95, the network 56 also has a terminating capacitor 98 (having one terminal connected to the line 67) that is connected (via a switch circuit 97) to the reference voltage level VREF during the conversion mode and connected to the reference voltage V+ during the amplification mode. The switch circuit 97 receives a signal called SHLOG which is asserted, or driven high, during the conversion mode (to indicate the capacitor 98 should be connected to the reference level VREF) and negated, or driven low, during the amplification mode (to indicate the capacitor 98 should be connected to the reference voltage level V+).

Because the circuit 50 is part of a CMOS process, the switches (e.g., switches 70, 72, 73, and 74) may be CMOS transmission gates (i.e., transmission gates having an NMOS transistor in parallel with a PMOS transistor). To provide better correlation of the sampled input voltage, the sample and hold circuit 68 has two sampling paths to perform double sampling of the input voltage Vin to generate the voltage Vin*.

Other embodiments are within the scope of the following claims.

What is claimed is:

1. A circuit having first and second modes, comprising:
   an analog-to-digital converter having capacitors, the converter configured to use the capacitors during the first mode to furnish a digital representation of an analog input voltage;
   an amplifier having a gain responsive to a capacitance; and
   switches configured to, during the second mode, selectively connect the capacitors to the amplifier to select the gain.

2. The circuit of claim 1 wherein the second mode occurs at a time other than during the first mode.

3. The circuit of claim 1 further comprising:
   logic configured to operate the switches and store the digital representation.

4. The circuit of claim 1 wherein the amplifier is further configured to:
   receive the analog input voltage, and
   furnish an amplified representation of the analog input voltage to the analog-to-digital converter.

5. The circuit of claim 1, wherein
   the analog-to-digital converter is disabled during the second mode, and
   the amplifier is disabled during the first mode.

6. The circuit of claim 1 further comprising:
   a sample and hold circuit configured to furnish the analog input voltage.

7. The circuit of claim 1 wherein the amplifier comprises a switched capacitor integrator.

8. The circuit of claim 1 wherein the analog-digital converter comprises a successive approximation converter.

9. The circuit of claim 1, wherein the analog-to-digital converter comprises a comparator having a first input and a second input, wherein
   the first input is connected to a first reference potential,
   each capacitor has a terminal connected to the second input, and
   the comparator is configured to selectively connect other terminals of the capacitors to either the first reference potential or a second reference potential to furnish the digital representation.

10. The circuit of claim 1,
    wherein the amplifier comprises an analog amplifier having a feedback path, and
    the capacitors are selectively connected in series with the feedback path during the second mode.

11. The circuit of claim 1, wherein the amplifier has an output, further comprising:
    another switch configured to connect the amplifier to the analog-to-digial converter during the second mode and disconnect the output from the analog-to-digial converter during the first mode.

12. A method comprising:
    during a first mode, using capacitors to furnish a digital representation of an analog input voltage; and during a second mode, using the capacitors to select a gain of an amplifier.

13. The method of claim 12 wherein the second mode occurs at a time other than during the first mode.

14. The method of claim 12 further comprising:

latching the digital representation.

15. The method of claim 12 further comprising:

using the amplifier to furnish an amplified representation of the analog input voltage; and providing the amplified representation to the analog-to-digital converter.

16. The method of claim 12, further comprising:

disabling the analog-to-digital converter during the second mode, and disabling the amplifier during the first mode.

17. The method of claim 12, further comprising:

sampling a continuous signal to generate the analog input voltage; and holding the analog input voltage.

18. The method of claim 12, wherein the amplifier has an output, further comprising:

connecting the amplifier to the analog-to-digital converter during the second mode; and disconnecting the output from the analog-to-digial converter during the first mode.

* * * * *